United States Patent [19]

Elms et al.

[11] Patent Number: 5,050,172
[45] Date of Patent: Sep. 17, 1991

[54] MICROCOMPUTER CONTROLLED ELECTRIC CONTACTOR WITH POWER LOSS MEMORY

[75] Inventors: Robert T. Elms, Monroeville Boro; Gary F. Saletta, Penn Township, Westmoreland County, both of Pa.

[73] Assignee: Westinghouse Electric Corp., Pittsburgh, Pa.

[21] Appl. No.: 348,940

[22] Filed: May 8, 1989

[51] Int. Cl.⁵ .................................. G11C 14/00
[52] U.S. Cl. .................................. 371/66; 365/229
[58] Field of Search ............... 307/132 E; 361/31; 364/184, 273.4, 492, 464.02; 365/228, 229; 371/66; 318/434, 476

[56] References Cited

U.S. PATENT DOCUMENTS

| | | | |
|---|---|---|---|
| 3,859,638 | 1/1975 | Hume, Jr. | 365/229 X |
| 4,534,018 | 8/1985 | Eckert et al. | 365/228 |
| 4,626,831 | 12/1986 | Engel | 340/50 |
| 4,635,204 | 1/1987 | Jones et al. | 364/464.02 |
| 4,674,035 | 6/1987 | Engel | 361/154 |
| 4,710,840 | 12/1987 | Shepler et al. | 365/228 X |
| 4,720,763 | 1/1988 | Bauer | 364/200 |
| 4,747,057 | 4/1988 | DiGiulio et al. | 364/464.02 |

*Primary Examiner*—Stephen M. Baker
*Attorney, Agent, or Firm*—M. J. Moran

[57] ABSTRACT

The coil of an electromagnetic contactor is controlled by a microcomputer which stores control data in an internal RAM memory. An integrated circuit chip provides a tightly regulated +5 volt supply voltage to the microcomputer and generates reset signals on power up and power loss. A logic circuit distinguishes a power loss reset from a power up reset and transfers the microcomputer to a STOP mode in which only the RAM is energized to retain the control data. Reserve power to energize the RAM during a power loss of up to several minutes in duration is provided by a large capacitor which is kept charged by the regulated +5 volt supply. Voltage on the capacitor is checked through the integrated circuit on power up to determine if sufficient voltage was maintained to assure the integrity of the RAM.

2 Claims, 4 Drawing Sheets 5,050,172

MICROCOMPUTER CONTROLLED ELECTRIC CONTACTOR WITH POWER LOSS MEMORY

RELATED APPLICATION

Commonly owned U.S. Pat. Application Ser. No. 201237, now U.S. Pat. No. 4,819,118, entitled "Electro Magnetic Contactor Tandem Control System for Thermal Protection of a Bi-Directional Motor Drive", filed on June 2, 1988 in the names of Dennis A. Mueller and Gary F. Saletta.

BACKGROUND OF THE INVENTION

1. Field of the Invention

This invention relates to electromagnetic contactors controlled by a microcomputer, and more specifically to such a contactor having protection for loss of power to the microcomputer.

2. Background Information

U.S. Pat. No. 4,720,763 discloses an electromagnetic contactor which is controlled by a microcomputer. Such contactors are switch devices which are especially useful in motor starting, lighting control, and similar switching applications.

One of the functions of the microcomputer in the contactor of U.S. Pat. No. 4,720,763 is to control energization of the coil of the contactor electromagnet in a manner which assures rapid positive closure of the electrical contacts without damaging contact bounce. The microcomputer also provides overcurrent protection by monitoring current flowing through the contactor and tripping the contacts open if preset limits are exceeded.

The microcomputer and the remainder of the control circuit for the contactor are powered by a 60 Hz 120 volt source derived either from the line side of the contactor or an independent commercial source so that the control system remains operative even with the contacts of the contactor open. In the case of an overcurrent condition, the microcomputer prevents reclosure of the contacts for a specified period of time.

The microcomputer and the contactor of U.S. Pat. No. 4,720,763, are controlled by a custom integrated circuit chip similar to that disclosed in U.S. Pat. Nos. 4,626,831 and 4,674,035. This custom chip provides a reset signal to the microcomputer on power-up. The initialization process initiated in the microcomputer by the reset signal, includes checking the random access memory (RAM) for stored data indicating the status of the contactor. However, if power to the RAM has been interrupted, this data will be lost. Hence, if the contactor was in the trip state when power was lost, this status of the contactor would not be detected upon power up. Therefore, it is possible through momentary loss of power to lose the protection provided by the delay in restart. In fact, this might be done intentionally by an operator to override the delay and restart the motor or other component which receives power through the contactor.

Accordingly, there is a need for means for maintaining power to the memory of the microcomputer, at least during short-term power losses, so that the protection function of the contactor can be maintained.

There is a subordinate need for a reliable power source during the short-term loss of power.

There is also need for a simple, reliable, economical manner of transferring the microcomputer to the alternate power source upon loss of the conventional power source.

SUMMARY OF THE INVENTION

These and other needs are satisfied by an electrical contactor supervised by a microcomputer having an associated control circuit which generates reset signals on power up and on power loss, and which includes means generating a logic signal having a first logic level when the voltage of the contactor power supply is above a selected value and having a second logic level otherwise. The microcomputer is programmed to operate, in response to the first logic level of the logic signal and a reset signal, that is in response to a power-up reset signal, in a normal mode in which the microcomputer is fully energized. The microcomputer is further programmed to operate, in response to the second logic level of the logic signal and a reset signal, that is in response to a loss of power reset signal, in a stop mode in which only the microcomputer data memory (RAM) is energized. A reserve power source, preferably a large capacitor, provides power to the memory in the stop mode.

BRIEF DESCRIPTION OF THE DRAWINGS

A full understanding of the invention can be gained from the following description of the preferred embodiment when read in conjunction with the accompanying drawings in which.

DESCRIPTION OF THE PREFERRED EMBODIMENT

Figure 1A:
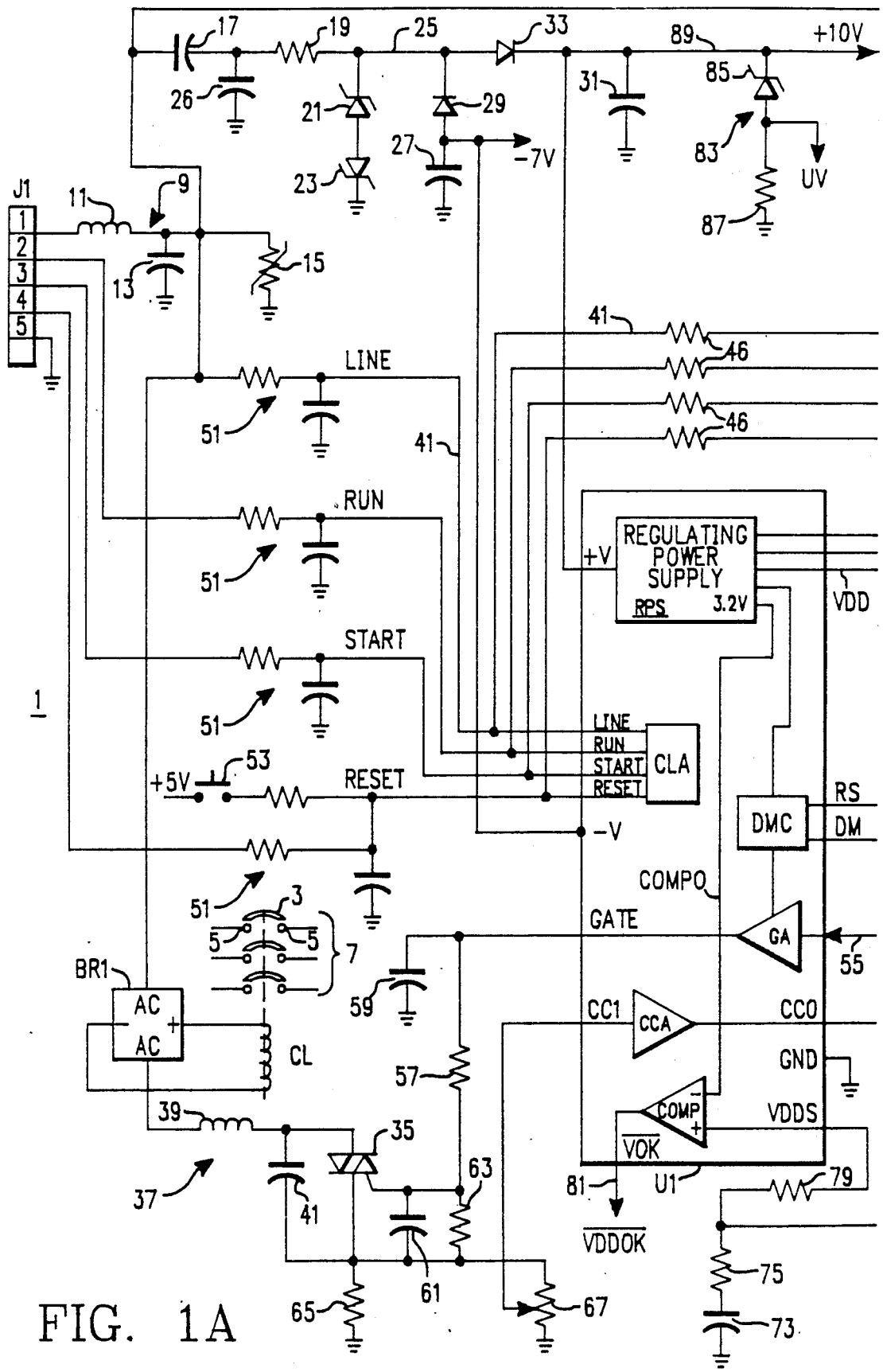
FIGS. 1A and 1B, when placed sided by side, comprise a schematic circuit diagram of a microcomputer controlled electrical contactor in accordance with the invention.
Figure 1B:
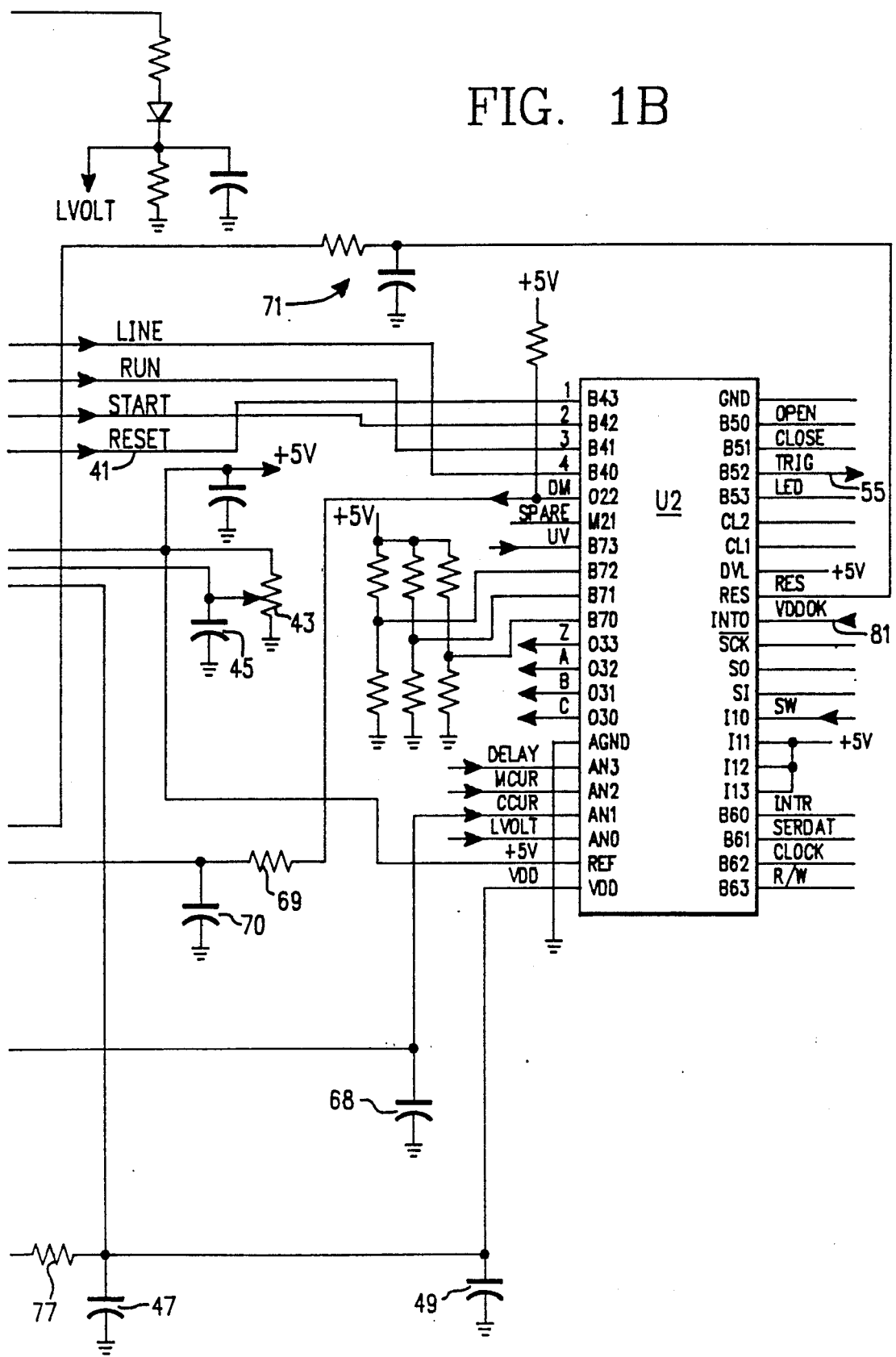

FIGS. 1A and 1B illustrate the electrical contactor of U.S. Pat. application Ser. No. 201,237 filed on June 2, 1988 to which the invention has been applied. The contactor 1 includes a set of three-phase first electrical contacts 3 which are brought into engagement with a second set of three-phase fixed contacts 5 to switch power in a three phase electrical power line 7. The contacts 3 and 5 are biased to a normally open position by springs (not shown) and are closed by an electromagnet which includes a coil CL. The mechanical details of the contactor are disclosed in U.S. Pat. No. 4,720,763.

Commercial 120 volt 60 Hz power for the control circuits of the contactor 1 is provided through terminals 1 and 5 of terminal strip J1. A first LC filter 9 comprising series inductor 11 and shunt capacitor 13 removes noise from the line power, while a varistor 15 suppresses spikes. The ac power is applied to a full wave rectifier bridge circuit BR1 which provides pulsed dc current to the contactor coil CL.

The filtered line current is applied, through a capacitive ballast 17 and a small resistor 19 which reduces in-rush current, across a pair of back to back zener diodes 21 and 23 selected to limit the voltage on lead 25 to $+10$ volts and $-7$ volts. A shunt capacitor 26 further reduces noise in the power supply to the line 25. A capacitor 27 connected to the line 25 through blocking diode 29 provides a −7 volt dc power source. Similarly, capacitor 31 connected to the line 25 through blocking diode 33 produces a +10 volt supply of power.

Energization of the coil CL of the contactor 1 is controlled by a switch 35. This switch 35 may be a triac, such as for example, a BCRV5AM-12. A second LC filter 37 comprising series inductor 39 and shunt capacitor 41 limits the rate of change of voltage across the triac 35 to reduce noise sensitivity of the switch.

The triac 35 is controlled by a microcomputer U2 through a custom integrated circuit U1. The integrated circuit U1 is similar to that disclosed in U.S. Pat. Nos. 4,626,831 and 4,674,035. The circuit U1 includes a regulating power supply RPS energized by the +10 volt supply applied to the +V input. The regulating power supply RPS generates a nominal +5 Vdc signal which may be trimmed by a potentiometer 43. A capacitor 45 reduces noise in this 5 volt signal. The five volt signal is applied to an analog input, REF, of the microcomputer U2 as a reference voltage. The regulating power supply RPS also generates a tightly regulated +5 volt dc signal VDD which is applied to the microcomputer U2 as the 5 volt microcomputer supply voltage. A large capacitor 47 removes dips in the supply voltage VDD generated by switching of the CMOS integrated circuits of the microcomputer U2. A second capacitor 49 removes noise from the 5 volt supply. Regulating power supply RPS also supplies power to a dead man circuit DMC, the function of which will be explained shortly. The regulated power supply RPS further generates a 3.2 volt signal COMPO which is applied to a comparator COMP for a purpose to be explained.

The filtered 120 volt ac current is applied through an RC filter 51 to a LINE input to the circuit U1, and through an input resistor 46, to an input to the microcomputer U2. Similarly, a RUN signal input at the terminal 2 of the terminal strip J1, a START signal applied through terminal 3 and a RESET signal supplied at terminal 4, are applied through RC filters 51 to corresponding inputs of the circuit U1, and through input resistors 46 to the microcomputer U2. A clipping and clamping circuit CLA in the integrated circuit U1 limits the range of these signals supplied to the microcomputer U2 to selected limits (+4.6 positive and −0.4 volts negative in the exemplary circuit) regardless of whether the associated signal is a dc or ac voltage signal. A button 53 powered by the +5 volt supply generated by the integrated circuit U1 permits manual generation of a RESET signal.

In response to the external control signals and its internal program, the microcomputer U2 generates trigger pulses TRIG at an output port. These pulses are applied through a lead 55 to the TRIG input of the integrated circuit U1. A gate amplifier GA within the integrated circuit U1 buffers and amplifies the trigger pulses and applies them through a GATE output and a current limiting resistor 57 to the gate electrode of the triac 35. A capacitor 59 reduces the noise in these pulses, and capacitor 61 and resistor 63 reduce the sensitivity of the triac 35 to noise.

As explained in U.S. Pat. No. 4,720,763, gating of the triac 35 is phase controlled relative to the ac line voltage by the timing of the trigger pulses by the microcomputer U2 to regulate the closing dynamics of the contactor contacts and to maintain the contactor closed. The voltage drop across a resistor 65, which is a measure of the current through the coil CL, is adjusted by a potentiometer 67 and applied to the CCI input of the integrated circuit U1 where it is amplified in an operational amplifier CCA. The resulting signal CCUR appearing at the output CCO of the integrated circuit U1 is applied to an analog input of the microcomputer U2. This signal, which is representative of the coil current, is used by the microcomputer to regulate the timing of the trigger pulses. A capacitor 68 reduces noise in the signal CCUR.

The microcomputer U2 generates at an output 022 a squarewave dead man signal DM which, for normal operation of the microcomputer, has a duty cycle of about 50%. This signal is applied through a resistor 69 to an integrating capacitor 70 which extracts the dc component from this square wave signal. In reality, this extracted signal varies somewhat in amplitude, but under normal operating conditions will remain within defined limits. This signal is applied to the dead man circuit DMC in the integrated circuit U1 through the DM input. If this signal exceeds preset high or low limits, a RESET signal is generated at an RS output of the integrated circuit U1. This RESET signal is applied through an RC filter 71 which removes spurious pulses to the RES input of the microcomputer U2. This RESET signal resets the microcomputer. The dead man circuit DMC applies RESET signals to the microcomputer U2 on power up and also on loss of power. The dead man circuit DMC also generates a signal which is applied to the gating amplifier GA to terminate the generation of pulses when a RESET signal is generated.

As previously mentioned, the microcomputer U2 contains memory in which data used in controlling the current in the coil CL is stored. This memory is in the form of RAM which must have continuous energization in order to retain the data. As described in U.S. Pat. application Ser. No. 201,237 filed June 2, 1988, the microprocessor U2 can be programmed to provide overcurrent protection for, for instance, a motor connected to the power line 7 by the contactor. If an overcurrent condition is detected, the microcomputer trips the contactor by terminating the trigger pulses to the triac 35. It also stores a TRIP flag in the RAM which is used to block restarting of the motor for a predetermined period of time which would allow the motor to cool down. Without the present invention, if power to the microprocessor U2 is interrupted, the trip flag is lost from RAM. When power is restored and a RESET signal is generated, the microcomputer checks the RAM and finding no trip flag, would permit restarting of the motor. Thus, by momentarily turning the power off and then back on, the cooling protection feature of the contactor could be defeated.

The present invention provides a solution to this problem. The exemplary μPD7533 microcomputer has a STOP mode in which energization is removed from all parts of the microcomputer except the RAM. Thus, all functions of the microcomputer cease although data stored in the RAM is retained.

With collapse of the power supply an alternate source of power must be provided to maintain energization of the RAM. Current drawn by the RAM only is about 1 microamp compared to about 1 milliamp drawn by the entire microcomputer in the normal operating mode. This 1 microamp of current must be supplied by a reserve power source. A battery is not durable enough for such use. In accordance with the invention, this small amount of current is provided by charge stored in a large capacitor 73. The capacitor 73 is connected to the +5 volt power supply VDD and to the microcomputer VDD pin through resistors 75 and 77. The voltage at the junction between resistors 75 and 77 is applied through an input resistor 79 to a VDDS input of the integrated circuit U1. This signal is compared in the comparator COMP with the 3.2 volt signal from the regulating power supply RPS to generate a $\overline{VOK}$ signal. When checked immediately after power up, this comparison indicates whether the voltage supplied to the microcomputer during power down remained above a preset minimum level (+2 volts) and feeds back this information to the computer over a lead at 81 as a $\overline{VDDOK}$ signal applied to the INTO input of the microcomputer.

$\overline{VDDOK}$ is used by the microcomputer to check the integrity of the reserve power supply upon startup. As previously mentioned, in the STOP mode, power is only supplied to the RAM which draws about 1 microamp of current to retain memory. The voltage at VDD must be at least +2 volts dc to assure the integrity of RAM memory. On startup, one of the first functions performed by the microcomputer is to evaluate the integrity of RAM memory. This is done by checking the voltage across the capacitor 73 which supplied power to the RAM in the STOP mode. If this voltage remains above +2 volts, memory is considered valid. Since, VDDS is compared with a 3.2 volt reference, the value of resistor 75 is chosen to add 1.2 volts to the voltage across capacitor during startup. If the $\overline{VOK}$ signal is a logical 0 when checked on startup, voltage across capacitor 73 has remained above +2 volts and therefore the data a RAM memory is considered valid. The resistor 77 has a large value which limits charging current to the capacitor 73 so that the voltage across this capacitor has not changed appreciatively by the time that the microcomputer checks $\overline{VDDOK}$ on startup.

The size of capacitor 73 is selected to store sufficient charge at the +5 volts of the power supply to be able to supply the required 1 microamp of current to the microcomputer in the STOP mode for a selected period of time at a voltage which remains above +2 volts. In the exemplary circuit, capacitor 73 has a value of 220 microfarads which is selected to provide reliable power to the RAM memory for about two minutes.

It has been seen that transferring the microcomputer to the STOP mode preserves memory in the RAM. Means must be provided, however, for the microcomputer to recognize the impending power loss and transfer to the STOP mode without depleting the reserve power source. While the custom integrated circuit U1 generates a RESET signal on power down, the microcomputer cannot distinguish between this RESET signal and the RESET signal generated on power up. In order to provide this capability, a signal is generated for a logic input to the microprocessor which indicates when the power supply is failing. This signal, UV, is generated by a circuit 83 which includes a zener diode 85 connected in series with a resistor 87 between the +10 volt dc line of the power supply and ground. The signal UV which is the voltage across the resistor 87 is applied to the logic input B73 of the microcomputer U2. As is conventional for the CMOS circuitry used in the microcomputer U2, a voltage above 3.5 volts dc is recognized by the input B73 as a logic 1. The zener diode 85 in the exemplary system is selected to have a breakover voltage of 5.6 volts. Thus, a voltage of 3.5 volts will appear across the resistor 87 as long as the supply line 89 has a voltage of 9.1 volts or greater. When the supply voltage begins to collapse and drops below 9.1 volts on the lead 89, a logical zero is read by the microcomputer. While the regulating power supply RPS generates the regulated +5 volt supply voltage from the voltage on the line 89, it continues to generate +5 volt supply voltage until the voltage on line 89 drops to nearly 5 volts. The regulated power supply then remains about a half a volt below the voltage on line 89 all the way down to zero volts. Thus, the microcomputer continues to receive +5 volts supply as the power supply on line 89 begins decay. The dead man DMC, however, detects this voltage collapse and generates the power down RESET signal. The microcomputer U2 recognizes this as a power down RESET signal because the signal UV is a logical zero at this point. The microcomputer then transfers to the STOP mode before the +5 volt source to VDD has been lost.

Figure 2:
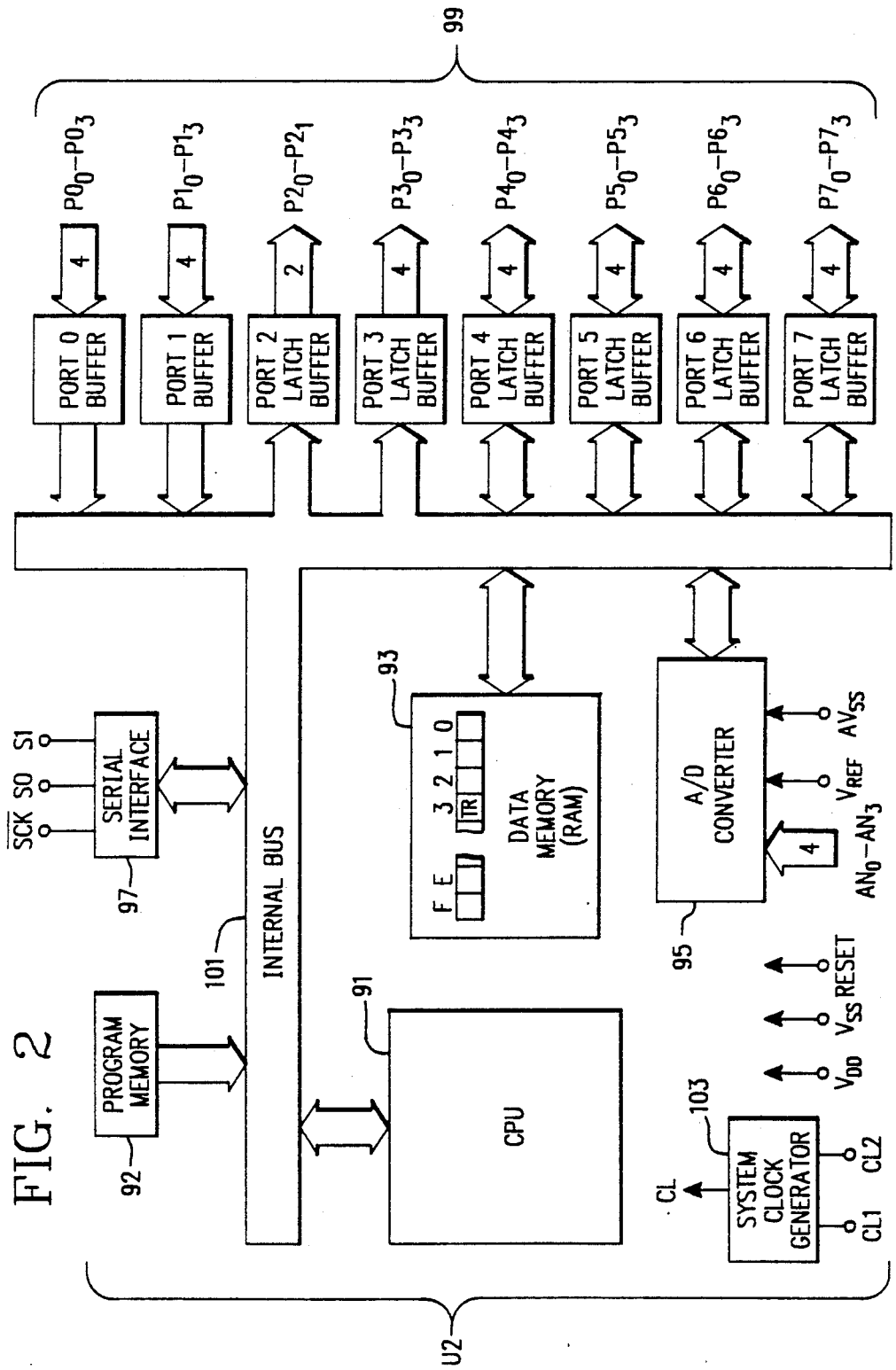
FIG. 2 is a schematic diagram in block form of a microcomputer suitable for use in the contactor illustrated in FIG. 1.

FIG. 2 illustrates schematically the NEC Electronics, Inc. μPD7533 microcomputer U2 used in the exemplary system. The μPD7533 is a four-bit, single-chip CMOS microcomputer with a four-bit CPU 91, a 4K program memory 92, a 160 × 4 bit RAM data memory 93, a four-channel, eight-bit A/D converter 95, and an eight-bit serial interface 97. The PD7533 has 30 input/output lines in the form of eight buffered ports, including two four-bit input ports 0 and 1, a two bit latched output port 2, one four-bit output port 3, three four-bit input/output ports (two of which can function in eight-bit units) 4-6 and one four-bit input/output port usable at bit level 7. Data is transmitted between these components over an internal bus 101. The system clock generator 103 has inputs CL1 and CL2 across which can be connected a crystal to set the desired clock frequency. The +5 volt power supply is connected at input VDD, and a ground is connected to the VSS input. The RESET signals from the custom integrated chip U1 are received on the RESET input.

As shown by the partial RAM map illustrated for the RAM 93, one of the bits of information stored in the data memory is the trip condition identified by the flag TR in FIG. 2. This flag is set when the microcomputer detects an overcurrent condition and generates a trip signal which terminates tiggering the triac 35 so that the contacts 3 and 5 open. With the present invention, the integrity of the microcomputer RAM is maintained so that following a short-term power failure, the trip indication is retained to prevent immediate restart of the motor controlled by the contactor.

Figure 3:
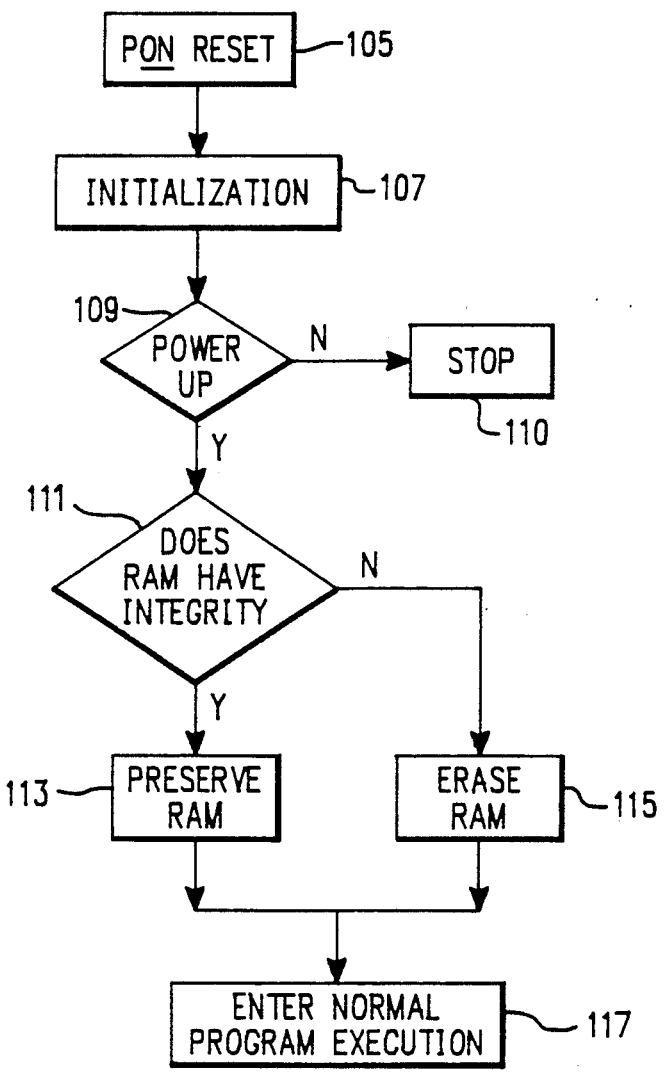
FIG. 3 is a flow chart of the pertinent part of the program utilized by the microcomputer of FIG. 2 in accordance with the invention.

FIG. 3 illustrates a flow chart utilized by the microprocessor U2 to implement the present invention. The receipt by microcomputer at any time of a RESET signal causes the computer to return to a home position $\underline{PON}$ as indicated at block 105 in the flow chart. At this point, the microcomputer has not distinguished between a power up and a power loss reset. The microcomputer then performs housekeeping initialization as indicated at 107. A determination is then made at 109 as to whether this was a power up reset. As discussed previously, this is accomplished by determining the logic level of the input B73. If this input is a logic 1, then it is a power up reset. If the logic level is zero, it is a power down reset and the stop instruction is generated at 110 which as previously discussed, results in deenergization of the entire microprocessor except for RAM 93.

If the reset is a power up reset, a determination is made at 111 as to whether the RAM has integrity. Again, as previously discussed, integrity of the RAM is determined by checking the voltage $\overline{VDDOK}$ which will be a logic zero indicating that integrity has been maintained if the voltage across the capacitor 73 supplying power to the microcomputer in the stop mode has remained above two volts. If RAM integrity has been maintained, the data stored in RAM is preserved at 113. If not, data is erased from RAM at 115. In either case, normal program execution is entered at 117.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. In an electrical contactor having first and second electrical contacts which are normally open:
   an electrical coil which when energized closes said first and second electrical contacts;
   means energizing said electrical coil including:
   a power supply;
   a microcomputer energized by said power supply and programmed to control energization of said electrical coil by said power supply, said microcomputer having a memory in which data used to control energization of said electrical coil is stored;
   first circuit means generating reset signals for said microcomputer when the power supply is powered up and when the power supply collapses;
   means generating a logic signal having a first logic level when the voltage of the power supply is above a selected value and having a second logic level otherwise, said means generating said logic signal comprising: a zener diode and a resistor connected in series across a portion of the power supply, a logic level input port to said microcomputer which generates said logic level signal of the first logic level when an applied signal is above a predetermined threshold and generates said logic level signal of the second level otherwise, and means applying the voltage across said resistor to said logic level input port as said applied signal, said zener diode having a break over voltage and said resistor having a value selected to generate a voltage across said resistor which exceeds said threshold when said voltage of the power supply is above the selected value; and
   said microcomputer being further programmed to operate, in response to the first logic level of said logic signal and a reset signal, in a normal mode in which the microcomputer is fully energized, and to operate, in response to the second logic level of said logic signal and a reset signal, in a stop mode in which only said memory is energized, said power supply including a reserve power source providing power to said microcomputer to energize said memory in said stop mode, said reserve power source comprising a capacitor charged by said power supply and connected to a power input to said microcomputer, said capacitor being of a size to store sufficient charge to supply current to the microcomputer to operate in the stop mode for a preselected interval of time; means for monitoring the voltage across said capacitor, wherein said microcomputer is further programmed to clear out selected data stored in said memory in response to a reset signal and the first logic level of said logic signal when said voltage across the capacitor is below a predetermined voltage needed to maintain the integrity of said memory.

2. A microcomputer having a memory in which data generated by the microcomputer is stored;
   a power supply energizing said microcomputer, and including a reserve power source;
   a control circuit generating reset signals which are applied to said microcomputer when said power supply is powered up and when a voltage generated by said power supply collapses; and
   means generating a logic signal of a first level when a voltage generated by said power supply is above a preselected level and having a second logic level otherwise; said means generating said logic signal comprising a zenor diode and a resistor connected in series across a portion of the power supply, a logic level input port to the microcomputer which generates said logic level signal of the first logic level when an applied signal is above a predetermined threshold and generates said logic level signal of the second level otherwise, and means applying the voltage across said resistor to said logic level input port as said applied signal, said zener diode having a break over voltage and said resistor having a value selected to generate a voltage across said resistor which exceeds said threshold when said voltage of the power supply is above the selected value; and
   said microcomputer being programmed to operate in a normal mode in which same microcomputer is fully energized by said power supply in response to the first logic level of said logic signal and a reset signal, and to operate in the stop mode in which said memory is energized by said reserve power source in response to the second level of said logic signal and a reset signal, said reserve power source comprising a capacitor charged by said power supply and connected to a power input to said microcomputer, said capacitor being of a size to store sufficient charge to supply current to the microcomputer to operate in the stop mode for a preselected interval of time; means for monitoring the voltage across said capacitor and wherein said microcomputer is further programmed to clear out selected data in said memory in response to a reset signal and a first logic level of said logic signal when said voltage across the capacitor is below a predetermined voltage needed to maintain the integrity of said memory.

* * * * *